US007976765B2

(12) United States Patent
Hersam et al.

(10) Patent No.: US 7,976,765 B2
(45) Date of Patent: Jul. 12, 2011

(54) SYSTEM AND METHODS OF LASER ASSISTED FIELD INDUCED OXIDE NANOPATTERNING

(75) Inventors: Mark C. Hersam, Evanston, IL (US); Liam S. C. Pingree, Seattle, WA (US)

(73) Assignee: Northwestern University, Evanston, IL (US)

( * ) Notice: Subject to any disclaimer, the term of this patent is extended or adjusted under 35 U.S.C. 154(b) by 121 days.

(21) Appl. No.: 12/180,173

(22) Filed: Jul. 25, 2008

(65) Prior Publication Data

US 2009/0085258 A1 Apr. 2, 2009

Related U.S. Application Data

(60) Provisional application No. 60/952,694, filed on Jul. 30, 2007.

(51) Int. Cl.
B29C 59/16 (2006.01)
(52) U.S. Cl. ..................................... 264/446; 250/492.1
(58) Field of Classification Search .................. 264/446; 250/492.1
See application file for complete search history.

(56) References Cited

U.S. PATENT DOCUMENTS 7,419,843 B2 * 9/2008 Park et al. ........................ 438/48

OTHER PUBLICATIONS

Teuschler, T., Mahr, K., Miyazaki, S., Hundhausen, M., Ley, L., "Nanometer-scale field-induced oxidation of Si(111):H by a conducting-probe scanning force microscope: Doping dependence and kinetics", Appl. Phys. Lett. 1995, 67(21), 3144-3146.*

Hwang, J.S., Hu, Z.S., Lu, T.Y., Chen, L.W., Chen, S.W., Lin, T.Y., Hsiao, C.-L., Chen, K.-H., Chen, L-C., "Photo-assisted local oxidation of GaN using an atomic force microscope", Nanotechnology 2006, 17, 3299-3303.*
C. Reagan Kinser et al., Kinetics and Mechanism of Atomic Force Microscope Local Oxidation on Hydrogen-Passivated Silicon in Inert Organic Solvents, Advanced Materials, 2006, p. 1377-1380, 18, Wiley-VCH Verlag GmbH & Co. KGaA, Weinheim.
J.A. Dagata et al., Modification of hydrogen-passivated silicon by a scanning tunneling microscope operating in air, Applied Physics Letters, May 14, 1990, p. 2001-2003, vol. 56, No. 20.
Phaedon Avouris et al., Atomic force microscope tip-induced local oxidation of silicon: kinetics, mechanism, and nanofabrication, Applied Physics Letters, Jul. 14, 1997, p. 285-287, vol. 71, No. 2.
B. Legrand et al., Nanooxidation of silicon with an atomic force microscope: A pulsed voltage technique, Applied Physics Letters, Jun. 28, 1999, p. 4049-4051, vol. 74, No. 26.
E.S. Snow et al., High speed patterning of a metal silicide using scanned probe lithography, Applied Physics Letters, Sep. 6, 1999, p. 1476-1478, vol. 75, No. 10.
E.S. Snow et al., The kinetics and mechanism of scanned probe oxidation of Si, Applied Physics Letters, Mar. 27, 2000, p. 1782-1784, vol. 76, No. 13.

(Continued)

*Primary Examiner* — Richard Crispino
*Assistant Examiner* — Elizabeth Royston
(74) *Attorney, Agent, or Firm* — Morris Manning Martin LLP; Tim Tingkang Xia, Esq.

(57) ABSTRACT

A method of forming a nanoscale pattern on a substrate surface. In one embodiment, the method includes the steps of providing a substrate having a surface; providing a nanoscale pattern forming device, comprising an elongated cantilever that has a tip portion proximate an end of the elongated cantilever; and controllably illuminating at least the tip portion of the cantilever with a beam of substantially coherent monoenergetic particles when the cantilever moves relative to the substrate to form a nanoscale pattern on the surface, wherein the tip portion of the cantilever is made from lightly doped silicon.

17 Claims, 6 Drawing Sheets

OTHER PUBLICATIONS

Brent A. Wacaser et al., Chemomechanical surface patterning and functionalization of silicon surfaces using an atomic force microscope, Applied Physics Letters, Feb. 3, 2003, p. 808-810, vol. 82, No. 5.

Z.A. Weinberg, On tunneling in metal-oxide-silicon structures, J. Appl. Phys., Jul. 1982, p. 5052-5056, vol. 53, No. 7.

G.H. Buh et al., Factors influencing the capacitance-voltage characteristics measured by the scanning capacitance microscope, Journal of Applied Physics, Aug. 15, 2003, p. 2680-2685, vol. 94, No. 4.

J.A. Dagata et al., Current, charge, and capacitance during scanning probe oxidation of silicon. I. Maximum charge density and lateral diffusion, Journal of Applied Physics, Aug. 15, 2004, p. 2386-2392, vol. 96, No. 4.

J.A. Dagata et al., Current, charge, and capacitance during scanning probe oxidation of silicon. II. Electrostatic and meniscus forces acting on cantilever bending, Journal of Applied Physics, Aug. 15, 2004, p. 2393-2399, vol. 96, No. 4.

Andreas Mandelis, Theory of space-charge layer dynamics at oxide-semiconductor interfaces under optical modulation and detection by laser photocarrier radiometry, Journal of Applied Physics, 2005, p. 083508-1-083508-11, vol. 97, No. 8.

W. I. Hamdi et al., Effect of strong illumination on current-voltage characteristics of Au/Si, Al/Si and Sn/Si Schottky barriers with native oxide layer, Journal of materials science: Material in electronics, 1997, p. 409-418, vol. 8.

Hiroyuki Sugimura et al., Nanoscopic Surface Architecture Based on Scanning Probe Electrochemistry and Molecular Self-Assembly, 1997, p. 9226-9229, vol. 119, No. 39.

Olivier Schneegans et al., Copper sample analyzed with an n-doped silicon tip using conducting probe atomic force microscopy, J. Vac. Sci. Technol. B, Sep./Oct. 2002, p. 1929-1934, vol. 20, No. 5.

Hua Jin et al., X-ray Studies of Self-Assembled Organic Monolayers Grown on Hydrogen-Terminated Si(111), Langmuir, 2004, p. 6252-6258, vol. 20, No. 15.

Mark E. Greene et al., Application of Scanning Probe Microscopy to the Characterization and Fabrication of Hybrid Nanomaterials, Microscopy Research and Technique, 2004, p. 415-434, vol. 64.

C. Reagan Kinser et al., Conductive Atomic Force Microscope Nanopatterning of Hydrogen-Passivated Silicon in Inert Organic Solvents, Nano Letters, 2005, p. 91-95, vol. 5, No. 1.

M Calleja et al., Nanometre-scale oxidation of silicon surfaces by dynamic force microscopy: reproducibility, kinetics and nanofabrication, Nanotechnology, 1999, p. 34-38, vol. 10, IOP Publishing Ltd.

Paul A. Anderson, Work Function of Gold, Physical Review, Aug. 1, 1959, p. 553-554, vol. 115, No. 3.

Geoffrey W. Brown et al., Observation of buried phosphorus dopants near clean Si(100)–(2×1) surfaces with scanning tunneling microscopy, Physical Review B, 2004, p. 121301-1-121301-4, vol. 70.

Richard D. Piner et al., "Dip-Pen" Nanolithography, Science, Jan. 29, 1999, p. 661-663, vol. 283, No. 661.

Nathan P. Guisinger et al., Room Temperature Negative Differential Resistance through individual Organic Molecules on Silicon Surfaces, Nano Letters, 2004, p. 55-59, vol. 4, No. 1.

* cited by examiner

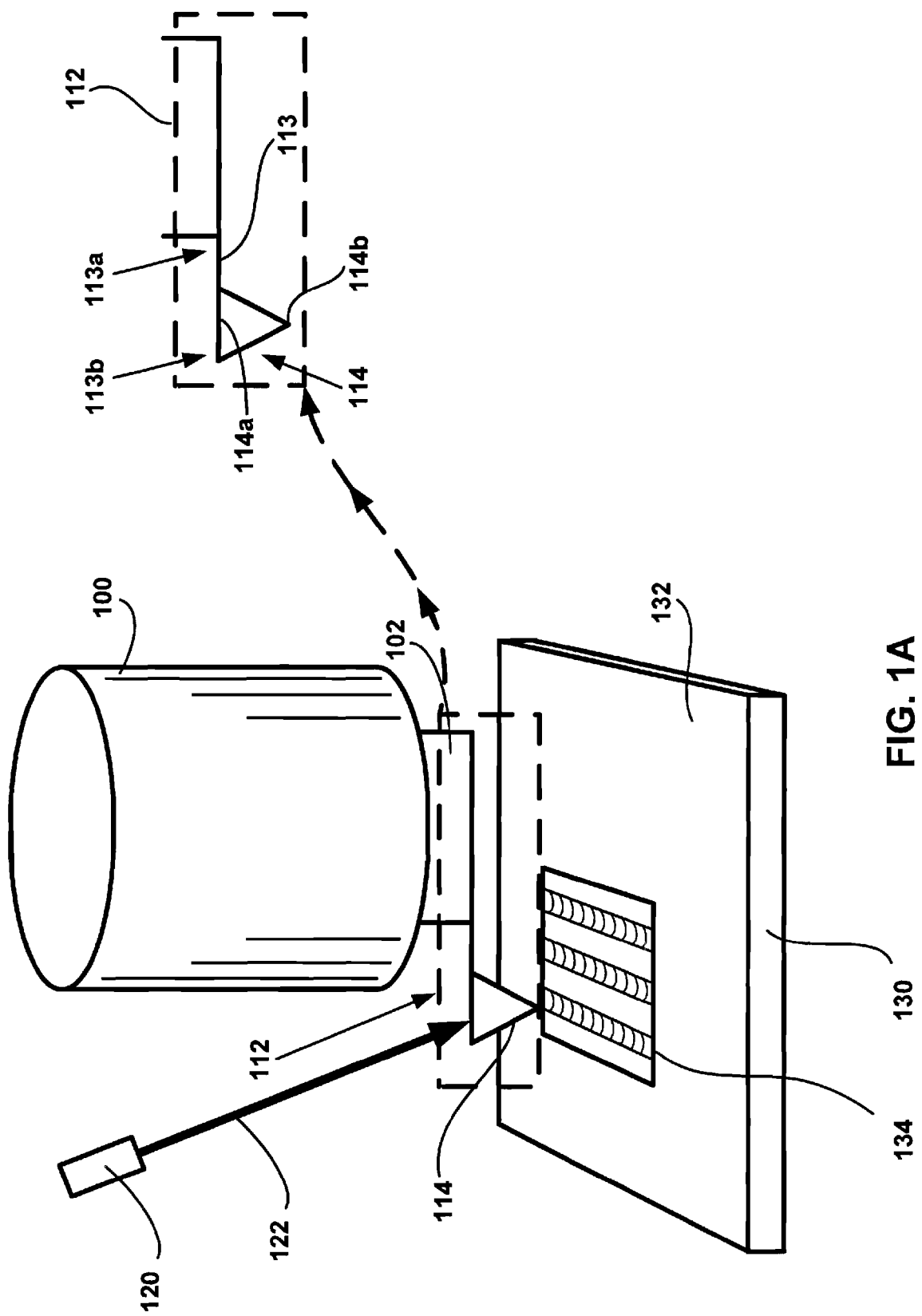

SYSTEM AND METHODS OF LASER ASSISTED FIELD INDUCED OXIDE NANOPATTERNING

CROSS-REFERENCE TO RELATED PATENT APPLICATION

This application claims the benefit, pursuant to 35 U.S.C. §19(e), of U.S. provisional patent application Ser. No. 60/952,694, filed Jul. 30, 2007, entitled "LASER ASSISTED FIELD INDUCED OXIDE NANOPATTERNING OF HYDROGEN PASSIVATED SILICON SURFACES" by Hersam et al., which is incorporated herein by reference in its entirety.

STATEMENT AS TO RIGHTS UNDER FEDERALLY-SPONSORED RESEARCH

This invention was made with Government support under Contract No. EEC-0647569 awarded by National Science Foundation of the United States and Contract No. W911NF-05-1-0177 awarded by the Young Investigator Program of Army Research Office of the United States. The government has certain rights in the invention.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, superscript "n" represents the nth reference cited in the reference list. For example, superscript "17" represents the 17th reference cited in the reference list, namely, H. Jin, C. R. Kinser, P. A. Bertin, D. E. Kramer, J. A. Libera, M. C. Hersam, S. T. Nguyen, and M. J. Bedzyk, Langmuir 20, 6252 (2004).

FIELD OF THE INVENTION

The present invention relates generally to forming a nanoscale pattern on a substrate surface, and more particularly to a system and methods of laser assisted field induced oxide nanopatterning on a substrate surface.

BACKGROUND OF THE INVENTION

Since the initial report of field induced oxidation of silicon surfaces with a scanning tunneling microscope by Dagata et al. in 1990,[1] numerous methods of silicon surface modification via scanning probe microscopy have been reported. Fabrication of sensor arrays,[2,3] lithography patterns,[4-6] and etch masks[7] via mechanical scribing,[8] dip-pen nanolithography,[9] and field induced oxidation (FIO) with an atomic force microscope (AFM)[10,11] have all been achieved. Beyond these applications, numerous mechanisms for the FIO process have been suggested.[5,12-16] Among these mechanisms, most reports agree that the oxidation rate is limited by various electrochemical reactions in the water meniscus that all initiate from charge injection from the probe into the meniscus.

Thus, although it was expected that schemes for influencing the charge injection rate may be exploited for the control of FIO nanopatterning, no practical method was discovered yet.

Therefore, a heretofore unaddressed need exists in the art to address the aforementioned deficiencies and inadequacies.

SUMMARY OF THE INVENTION

The present invention, in one aspect, relates to a method of forming a nanoscale pattern on a substrate surface. In one embodiment, the method includes the steps of providing a substrate having a surface; providing a nanoscale pattern forming device, comprising an elongated cantilever that has a tip portion proximate an end of the elongated cantilever; and controllably illuminating at least the tip portion of the cantilever with a beam of substantially coherent monoenergetic particles when the cantilever moves relative to the substrate to form a nanoscale pattern on the surface, wherein the tip portion of the cantilever is made from lightly doped silicon.

The present invention, in another aspect, relates to a method of forming a nanoscale pattern on a substrate surface. In one embodiment, the method includes the steps of providing a substrate having a surface; providing a nanoscale pattern forming device, comprising an elongated cantilever that has a tip portion proximate an end of the elongated cantilever; and illuminating at least the tip portion of the cantilever with a beam of substantially coherent monoenergetic particles when the cantilever moves relative to the substrate to form a nanoscale pattern on the surface, wherein the tip portion of the cantilever is made from a material that is responsive to the beam of substantially coherent monoenergetic particles.

The step of illuminating comprises the steps of toggling the beam such that when there is no need of patterning on the surface, at least the tip portion of the cantilever is not exposed to the illumination, and when there is a need of patterning on the surface, at least the tip portion of the cantilever is exposed to the illumination, respectively.

The present invention, in yet another aspect, discloses a system of forming a nanoscale pattern on a substrate surface. In one embodiment, the system has a nanoscale pattern forming device, comprising an elongated cantilever that has a tip portion proximate an end of the elongated cantilever; and an energy source for illuminating at least the tip portion of the cantilever with a beam of substantially coherent monoenergetic particles when the cantilever moves relative to the substrate to form a nanoscale pattern on the surface, wherein the tip portion of the cantilever is made from a material that is responsive responsible to the beam of substantially coherent monoenergetic particles.

The material that is responsible to the beam of substantially coherent monoenergetic particles comprises doped n-type silicon or doped p-type silicon that has a free carrier concentration excitable by the beam of substantially coherent monoenergetic particles.

The nanoscale pattern forming device comprises an atomic force microscope (AFM) that is controllably movable at a scan rate and according to a predetermined trace corresponding to a nanoscale pattern to be formed.

The energy source comprises a laser, and the beam comprises a laser beam of photons.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

FIG. 1A is a schematic view of an atomic force microscope (AFM) head having a holder on which an illustrative nanoscale pattern forming device shown schematically mounted thereon for forming a nanoscale pattern on a surface with the help of an energy resource according to one embodiment of the present invention.

DETAILED DESCRIPTION OF THE INVENTION

Figure 1:
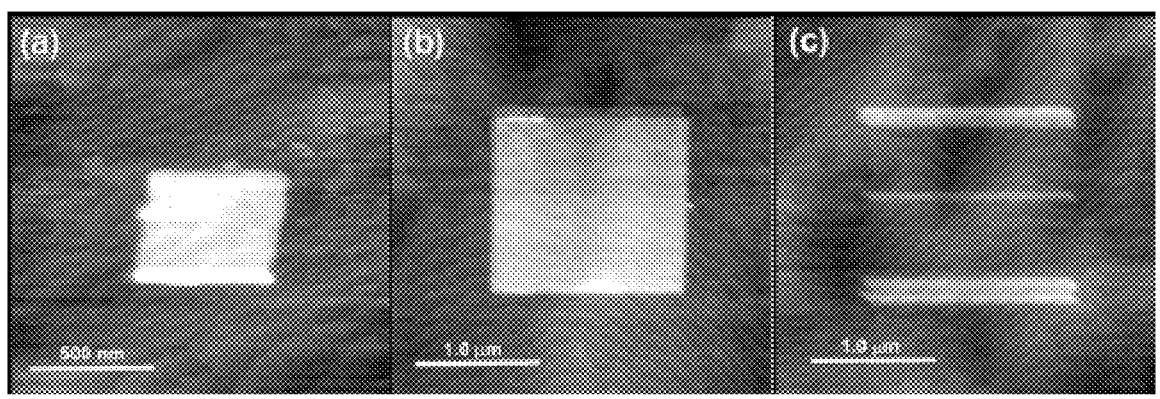
FIG. 1 shows AFM images of FIO patterns created under a constant applied sample bias of 10 V with uncoated silicon probes. Illumination of the AFM probe only occurred for the first and last about 15 scan lines as well as about 5 lines in the middle of the scan. Nanopatterns were created with (a) heavily doped n-type silicon probes, (b) heavily doped p-type silicon probes, and (c) lightly doped n-type silicon probes, respectively.
Figure 2:
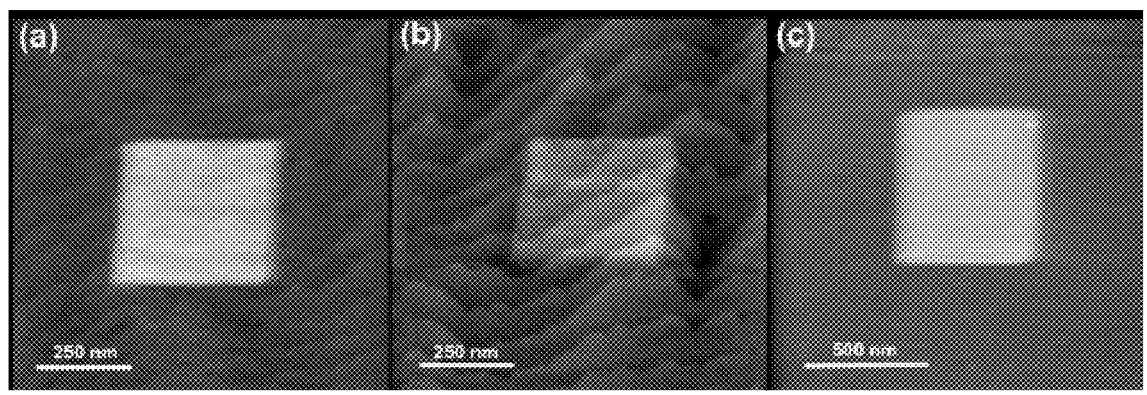
FIG. 2 shows AFM images of FIO patterns created under a constant applied sample bias of 10 V with coated silicon probes. Illumination of the AFM probe only occurred for the first and last about 15 scan lines as well as about 5 lines in the middle of the scan. Nanopatterns were created with probes coated with (a) gold, (b) conductive diamond, and (c) TiPt, respectively.
Figure 3:
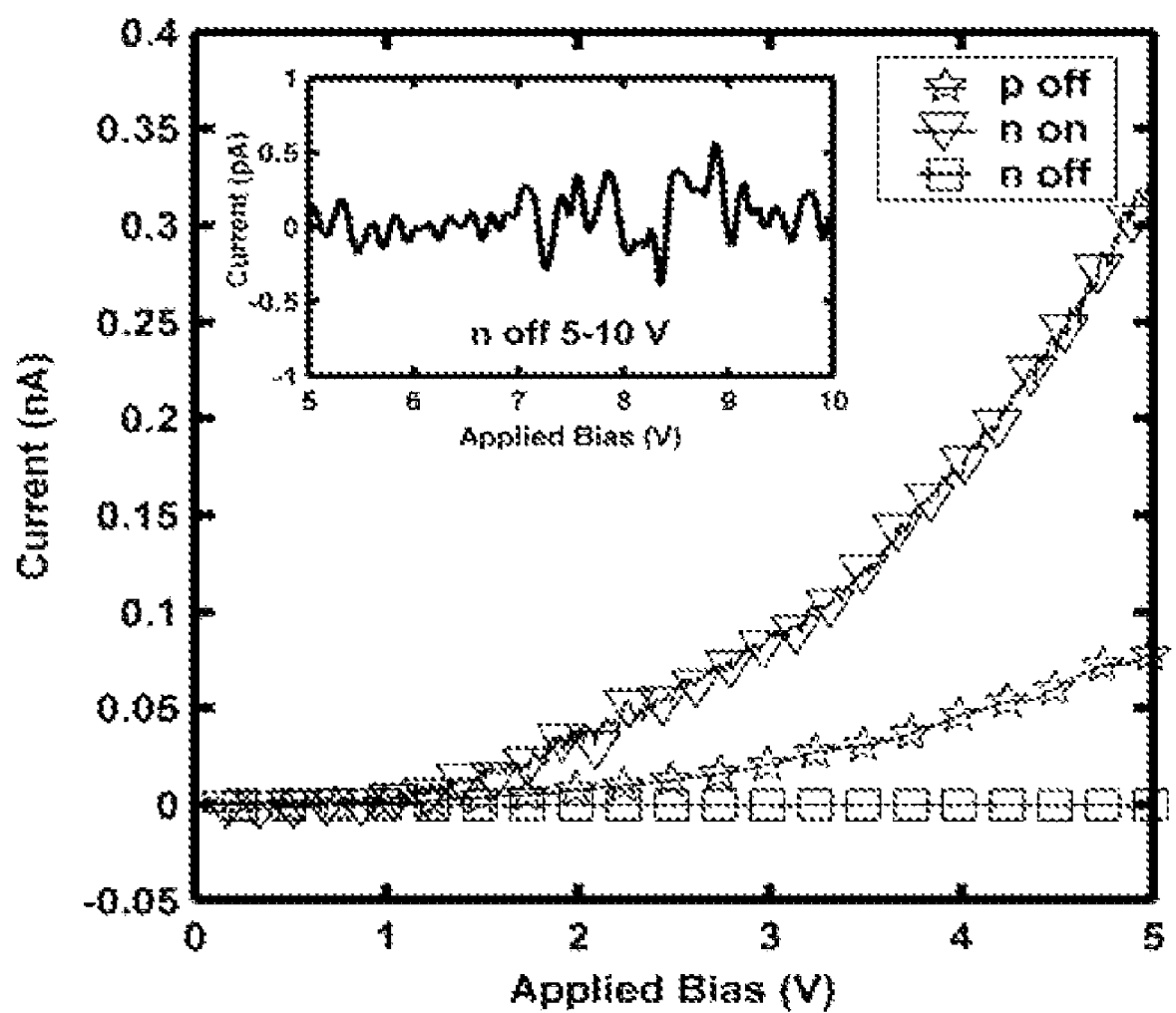
FIG. 3 shows current-voltage curves for silicon probes on a gold substrate for various tip doping and illumination conditions. "p off" refers to a heavily doped p-type silicon probe without illumination, and "n on/off" refers to a lightly doped n-type silicon probe with and without illumination respectively. The inset shows the "n off" trace between 5 and 10 V with the current axis magnified by a factor of about 400.

The present invention is more particularly described in the following examples that are intended as illustrative only since numerous modifications and variations therein will be apparent to those skilled in the art. Various embodiments of the invention are now described in detail. Referring to the drawings, like numbers indicate like parts throughout the views. As used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which has no influence on the scope of the invention. Additionally, some terms used in this specification are more specifically defined below.

Definitions

The terms used in this specification generally have their ordinary meanings in the art, within the context of the invention, and in the specific context where each term is used.

Certain terms that are used to describe the invention are discussed below, or elsewhere in the specification, to provide additional guidance to the practitioner in describing the apparatus and methods of the invention and how to make and use them. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and in no way limits the scope and meaning of the invention or of any exemplified term. Likewise, the invention is not limited to various embodiments given in this specification. Furthermore, subtitles may be used to help a reader of the specification to read through the specification, which the usage of subtitles, however, has no influence on the scope of the invention.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "atomic force microscope (AFM)" or scanning force microscope (SFM) refers to a very high-resolution type of scanning probe microscope, with demonstrated resolution of fractions of a nanometer, more than 1000 times better than the optical diffraction limit. The term "microscope" in the name of "AFM" is actually a misnomer because it implies looking, while in fact the information is gathered or the action is taken by "feeling" the surface with a mechanical probe. The AFM in general has a microscale cantilever with a tip portion (probe) at its end that is used to scan the specimen surface. The cantilever is typically silicon or silicon nitride with a tip radius of curvature on the order of nanometers. When the tip is brought into proximity of a sample surface, forces between the tip and the sample lead to a deflection of the cantilever according to Hooke's law. The AFM can be utilized in a variety of applications.

As used herein, a "lightly doped" material shall generally mean a material that has a resistivity>about 1.0 Ω-cm, where unit "Ω-cm" means ohms (Ω) times cm as known to people skilled in the art.

As used herein, a "heavily doped" material shall generally mean a material that has a resistivity<about 0.01 Ω-cm, where unit "Ω-cm" means ohms (Ω) times cm as known to people skilled in the art.

Overview of the Invention

The present invention, in one aspect, relates to a method of forming a nanoscale pattern on a substrate surface. In one embodiment, the method includes the steps of providing a substrate having a surface; providing a nanoscale pattern forming device, comprising an elongated cantilever that has a tip portion proximate an end of the elongated cantilever; and illuminating at least the tip portion of the cantilever with a beam of substantially coherent monoenergetic particles when the cantilever moves relative to the substrate to form a nanoscale pattern on the surface, wherein the tip portion of the cantilever is made from a material that is responsive to the beam of substantially coherent monoenergetic particles.

In particular, practicing the present invention leads to field induced oxide (FIO) nanopatterning of hydrogen passivated silicon surfaces with an atomic force microscope (AFM) that is controlled by laser irradiation. Specifically, local oxidation on H:Si(111) surfaces can be fully suppressed or activated by toggling a laser that is illuminating a lightly doped silicon AFM cantilever. The nanopatterning mechanism is attributed to the control of the free carrier concentration in the AFM probe by the laser. When the laser is toggled off, charge injection is terminated, thus eliminating the electrochemical reactions required for oxide formation. Laser assisted FIO provides an alternative and flexible means for controlling oxide nanopatterning.

Nanopatterning silicon surfaces have broad potential applications including nanoelectronics, nanoscale biological/chemical sensors, and nanoelectromechanical systems. As a result, many scanning probe microscope (SPM) manufacturers now sell nanolithography/nanopatterning toolkits as accessories. One of the most dramatic examples is the Northwestern spin-out company, NanoInk, which is entirely based on the commercialization of dip-pen nanolithography that is a complementary nanopatterning technique to field induced oxidation (FIO). Consequently, the present invention finds many applications in nanolithography and other areas of use.

Various unique features of the present invention will be made as to the embodiments of the present invention in conjunction with the accompanying drawings in FIGS. 1-5.

Referring to FIG. 1A first, the present invention, in one aspect, relates to a system of forming a nanoscale pattern on a substrate surface. In one embodiment, the system has a nanoscale pattern forming device, which in the embodiment as shown in FIG. 1A, is an atomic force microscope (AFM) that has a scanning head 100 having a tip or probe carrier 102, illustrated here schematically for purposes of illustration and not limitation. An elongated cantilever 112, which has a tip portion 114 proximate an end of the elongated cantilever 112, pursuant to an illustrative embodiment of the invention, is schematically shown disposed or mounted on the tip or probe carrier 102 for movement (e.g. raster scanning) with the elongated cantilever 112 to form a nanoscale pattern 134 on a surface 132 of a substrate 130. In doing so, the AFM hardware and software known to people skilled in the art can be used to move the scanning head 100 with the elongated cantilever 112 to form a pattern with nanometer resolution of pattern features on surface 132. For example, the scanning head 100 with the elongated cantilever 112 can be controlled by a chip or controller to move at a scan rate and according to a predetermined trace corresponding to a nanoscale pattern to be formed.

As shown, the elongated cantilever 112 has an arm 113 with a first end 113a and a second end 113b that is opposite to the first end 113a, where the tip portion 114 is proximate to the second end 113b of the arm 113. The tip portion 114 has a base 114a at a first end and a tip 114b at a second end that is opposite to the base 114a at the first end of the tip portion 114, where the base 114a is formed at the second end 113b of the arm 113 of the cantilever 112.

The system also has an energy source 120 for illuminating at least the base 114a of the tip portion 114 of the cantilever 112 with a beam 122 of substantially coherent monoenergetic particles when the cantilever 112 moves relative to the substrate 130 to form a nanoscale pattern on the surface 132, where at least the base 114a of the tip portion 114 of the cantilever 112 is made from a material that is responsive to the beam 122 of substantially coherent monoenergetic particles.

In one embodiment, the cantilever 112 including the tip portion 114 is made from a same material that is responsive to the beam 122 of substantially coherent monoenergetic particles.

In one embodiment, the energy source 120 is a laser, and the beam 122 is a laser beam of photons. The material that is responsive to the laser beam 122 of photons is doped n-type silicon or doped p-type silicon that has a free carrier concentration excitable by the laser beam 122 of photons. Pursuant to an illustrative embodiment of the invention, probes formed with lightly doped n-type silicon have been utilized to practice the present invention successfully.

Figure 5:
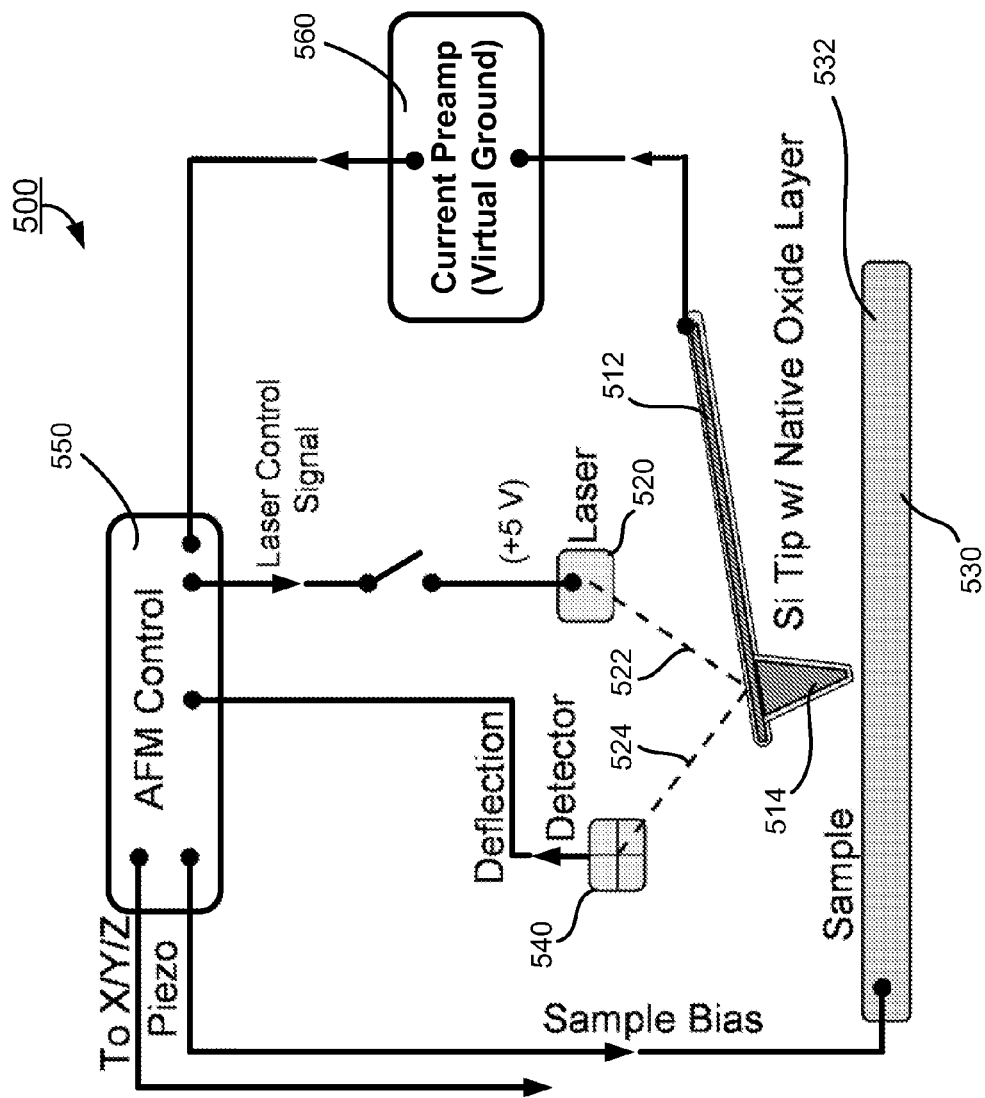
FIG. 5 is a schematic view of a system set up for conducting experiments related to system and methods of forming a nanoscale pattern on a surface with the help of an energy resource according to one or more embodiments of the present invention.

Referring to FIG. 5 now, a system 500 that can be not only used to practice the present invention for forming a nanoscale pattern on a substrate surface but also to monitor how well the present invention is practiced is illustrated here schematically for purposes of illustration and not limitation. In this embodiment, the system 500 has an atomic force microscope (AFM) that has an elongated cantilever 512, which has a tip portion 514 proximate an end of the elongated cantilever 512, to form a nanoscale pattern on a surface 532 of a substrate 530.

The system 500 also has a laser 520 for illuminating at least the tip portion 514 of the cantilever 512 with a beam 522 when the cantilever 512 moves relative to the substrate 530 to form a nanoscale pattern on the surface 532, where at least the tip portion 514 of the cantilever 512 is made from silicon coated with native oxide layer.

Detector 540 can be used to detect the laser deflection by the cantilever 512 through reflected beam 524. Current preamplifier 560 can be utilized to monitor current flow. Laser 520, detector 540 and preamplifier 560, together with the AFM, can be controlled by a controller 550.

These and other aspects of the present invention are further described below.

Examples and Implementations of the Invention

Without intent to limit the scope of the invention, exemplary methods and their related results according to the embodiments of the present invention are given below. Note again that titles or subtitles may be used in the examples for convenience of a reader, which in no way should limit the scope of the invention. Moreover, certain theories are proposed and disclosed herein; however, in no way they, whether they are right or wrong, should limit the scope of the invention.

EXAMPLES

In one embodiment, the present invention is practiced by controlling FIO nanopatterning under a constant bias by toggling the on/off state of a visible laser that is focused on the AFM cantilever. Several control experiments have been performed in an effort to pinpoint the mechanism of this laser assisted FIO process. For example, by exploring a variety of probe materials, laser assisted FIO is only shown to occur for lightly doped silicon probes where illumination is expected to significantly modulate the free carrier concentration of the probe. Furthermore, measurements of the current through the tip-sample junction for different doping and illumination conditions demonstrate that the magnitude of the injected current only drops to negligible levels for lightly doped silicon probes without illumination. These discoveries and observations suggest that the laser assisted FIO process results from optical control of the probe free carrier concentration, which in turn modulates charge injection and subsequent electrochemistry in the tip-sample water meniscus.

Experiments were performed on hydrogen passivated silicon (111) surfaces (H:Si(111), Virginia Semiconductor, Fredericksburg, Va., <0.01 Ω-cm arsenic-doped, <0.25° miscut) prepared by a previously reported procedure.[17] Other substrates may also be used. AFM was performed with a Thermo-Microscopes CP Research AFM with lightly doped n-type silicon (1-10 Ω-cm phosphorus-doped, Veeco, Plainview, N.Y.), heavily doped n-type silicon (0.01-0.25 Ω-cm, arsenic-doped, Veeco, Plainview, N.Y.), heavily doped p-type silicon (0.001 Ω-cm, boron-doped, Veeco, Plainview, N.Y.), conductive diamond coated silicon (Nanosensors, Redwood City, Calif.), gold coated silicon (MikroMasch, San Jose, Calif.), and TiPt coated silicon (MikroMasch, San Jose, Calif.) probes. Probes formed with other suitable materials may also be used. The AFM probe holder was electrically isolated from the AFM and connected to a variable gain current preamplifier (DL instruments model 1212) to monitor current flow during both pattern formation on H:Si(111) and bias sweeps applied to the silicon probes while in contact with thermally deposited gold-on-silicon substrates. The cantilever deflection laser is a 0.2 mW diode laser operating at a wavelength of 670 nm. Contact mode AFM was performed in ambient conditions (35-45% relative humidity, 22-24° C.) at a setpoint force of 10-30 nN, and patterns were created with a 10 V sample bias.

When performing experiments in the dark, spurious light was eliminated through the use of a black cloth surrounding the AFM apparatus and by turning off the laser used for cantilever deflection sensing. The maintenance of a relatively stable tip-sample contact force in the absence of the cantilever deflection laser required the following procedure. In particular, before the cantilever deflection laser was turned off, the AFM feedback loop was disengaged, and the cantilever deflection was subsequently stabilized by manually adjusting the tip-sample separation. Following this stabilization procedure, the patterning bias was applied to the probe, box patterning commenced, the probe deflection was confirmed, and the defection detection laser was turned off via an external switch. These steps required patterning about 15 lines prior to turning off the laser. After 128 of 256 scan lines were completed, the laser was turned back on to momentarily monitor the cantilever deflection, and small adjustments were made to the tip-sample separation if necessary. The laser was again turned off until approximately line 240 at which point the laser was again turned back on to confirm proper cantilever deflection. At the end of the scan area, the patterning bias was removed, the laser was turned back on, and the feedback loop was re-engaged. The patterned regions were then re-imaged in contact mode with no applied bias.

Results from these patterning procedures are shown in FIG. 1 for the three uncoated cantilevers. When heavily doped n-type silicon [FIG. 1(*a*)] and heavily doped p-type silicon [FIG. 1(*b*)] probes are used, uniform patterns are created independent of the laser status. However, when these patterning conditions are applied to a lightly doped n-type silicon probe, patterning only occurs when the laser is on [FIG. 1(*c*)], as indicated by the FIO lines in the fast-scan direction at the top, middle, and bottom of the patterned region. The applied bias was 10 V throughout the entire scan box for all three patterns shown in FIG. 1.

The same patterning procedure was subsequently applied with a series of metal and conductive diamond probes. Since the electronic properties of these probes are not expected to be affected by the cantilever deflection laser, this series of experiments was designed to pinpoint the effect of the laser on the underlying silicon substrate. As observed in the case of the gold coated [FIG. 2(*a*)], conductive diamond coated [FIG. 2(*b*)], and TiPt coated probes [FIG. 2(*c*)], no variations in the oxide thickness exist throughout each patterned region even though the laser was turned on and off according to the previously mentioned protocol. While the laser likely assists in creating excess minority carriers (holes) in the sample, the minority hole concentration in the absence of laser irradiation is apparently not the rate limiting step in the oxidation process. Incidentally, the role of the work function and hydrophobicity of the various probe materials is also evident, as the less hydrophilic diamond probe results in a thinner oxide than the oxide created by either metal coated probe.[18,19]

The aforementioned nanopatterning results strongly suggest that the laser is influencing the free carrier concentration in the lightly doped n-type silicon probes. To further verify this mechanism, current-voltage curves were measured for the lightly doped n-type silicon and heavily doped p-type silicon probes in contact with a gold surface [FIG. 3]. Although an increase in the interface resistance across the metal-insulator-semiconductor (MIS) junction (where the insulator is the native oxide coating on the tip) is apparent when the heavily doped p-type silicon probe is not illuminated, sufficient current flow for oxide patterning does occur even with the laser off.[5] In the case of the lightly doped n-type silicon probe, however, current flow is only observed under illumination. Without the assistance of laser irradiation, no measurable current is transported across the MIS junction for sample biases as high as 10 V [FIG. 3 inset]. These results suggest that the suppression of nanopatterning in the absence of laser irradiation for lightly doped n-type silicon probes can be attributed to insufficient current flow across the tip/oxide/meniscus junction.

Figure 4:
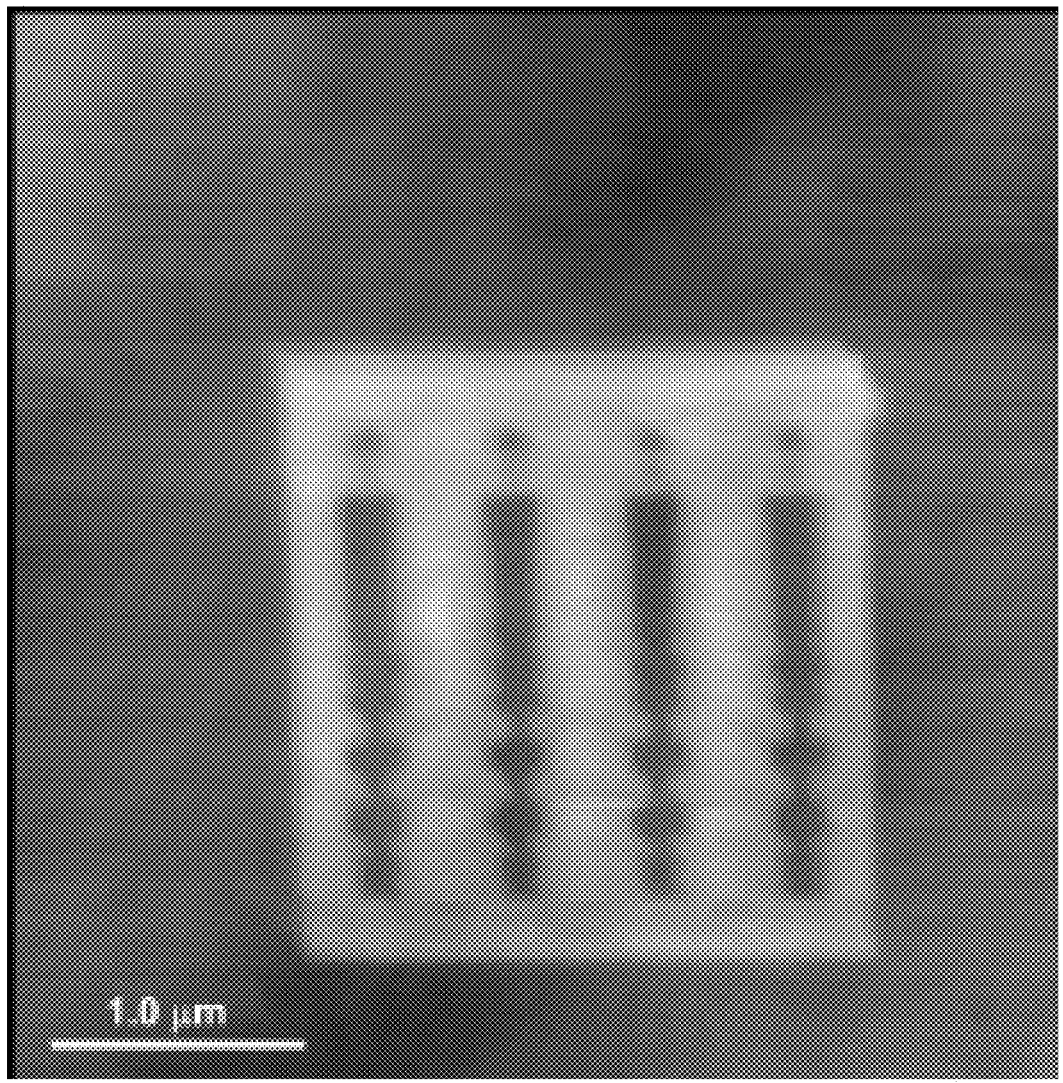
FIG. 4 shows AFM image of an FIO pattern created under a constant bias of 10 V with an 8 Hz toggle of the illumination (AFM fast scan speed is 1 Hz). The laser remained on (i.e., was not toggled) for the first and last 15 lines. In addition, the relative phase and frequency of the laser toggle signal compared to the fast scan signal was varied throughout the nanopatterning to demonstrate control over the linewidth.

To illustrate the utility of laser assisted FIO for nanopattern generation, oxide nanopatterns were generated by toggling the laser with a rate of 8 Hz while scanning a 4 $\mu m^2$ region with a fast scan rate of 1 Hz and a constant sample bias of 10 V. As seen in FIG. 4, the resulting oxide nanopattern reflects the 8 Hz laser toggle rate, as patterning only occurs when the laser is on (ridges), and no patterning occurs during the off cycles (troughs). At both the top and bottom of the scan, the laser was not toggled to confirm tip stability and a constant cantilever deflection. The feedback loop of the AFM was turned off during patterning, and the relative phase and frequency between the laser toggle signal and the fast scan signal were systematically tuned during pattern formation to generate the linewidth variations that are apparent in FIG. 4. In addition to demonstrating flexibility in nanopattern generation, these results also support the mechanism that laser assisted FIO is achieved through excitation of free carriers in the probe rather than variations in the tip-sample contact force or tip heating since significant variations in the force or temperature are unlikely to occur on this time scale.

The effects of laser illumination on AFM probes and substrates have previously been noted in scanning capacitance microscopy results[20] and current-voltage characteristics for uncoated silicon probes.[21] In both cases, the generation of excess carriers was noted as the mechanism for enhanced charge flow. The optical generation of carriers, especially in the presence of an applied field, can increase the effective doping at the tip/oxide interface to near degenerate levels. Consequently, the electric field across the tip/sample junction will be enhanced, thus creating suitable conditions for charge injection through the native tip oxide.[20]

Similar results have also been previously noted on macroscopic Schottky diodes fabricated with a native oxide barrier.[22-24] In these reports, illumination lowers the barrier height,[22,24] induces an accumulation of charge across the oxide layer,[23] and/or increases the number of carriers at the semiconductor/oxide interface.[24] Again, the net effect is an increase in the tunneling current across the semiconductor/oxide interface. Conversely, the absence of intense illumination eliminates charge injection across the tip/oxide barrier, which prevents subsequent electrochemistry within the water meniscus.

In conclusion, through the use of lightly doped silicon probes, laser assisted FIO has been established as a strategy for controlling oxide nanopatterning on hydrogen passivated silicon surfaces. By studying nanopatterning and charge transport behavior as a function of probe material and illumination conditions, laser irradiation was shown to control the probe free carrier concentration and resulting charge injection into the tip-sample water meniscus. This modulation of the charge injection subsequently implies control over the electrochemistry that drives the oxide nanopatterning process. In addition to identifying laser irradiation as a flexible and complementary means for controlling oxide nanopatterning on silicon surfaces, these results also demonstrate the importance of tip doping and/or coating for reliable FIO nanopatterning, especially when non-optical cantilever deflection detections schemes (e.g., piezoelectric sensing) are used.

The present invention, thus, in one aspect, discloses a method of forming a nanoscale pattern on a substrate surface. In one embodiment, the method includes the steps of providing a substrate having a surface; providing a nanoscale pattern forming device, comprising an elongated cantilever that has a tip portion proximate an end of the elongated cantilever; and controllably illuminating at least the tip portion of the cantilever with a beam of substantially coherent monoenergetic particles when the cantilever moves relative to the substrate to form a nanoscale pattern on the surface, wherein the tip portion of the cantilever is made from lightly doped silicon.

The step of controllably illuminating comprises the steps of toggling the beam such that where there is no need of patterning on the surface, at least the tip portion of the cantilever is not exposed to the illumination, and where there is a need of patterning on the surface, at least the tip portion of the cantilever is exposed to the illumination, respectively.

In one embodiment, the substrate surface comprises a hydrogen passivated silicon surface, wherein the hydrogen passivated silicon surface can be an H:Si(111) surface.

The nanoscale pattern forming device can be an atomic force microscope (AFM) that is controllably movable at a scan rate and according to a predetermined trace corresponding to a nanoscale pattern to be formed.

In practicing the method, the step of controllably illuminating includes controllably illuminating at least the tip portion of the cantilever with electromagnetic radiation, selected from visible and infrared radiations, such that the monoenergetic particles are photons.

The electromagnetic radiation is from a laser, and the beam comprises a laser beam of photons. The laser is operable at a wavelength in the range of 10 to 10,000 nm and at an output in the range of 0.05 to 1,000 mW.

The tip portion of the lightly doped silicon comprises lightly doped n-type silicon that has a free carrier concentration excitable by the beam of substantially coherent monoenergetic particles.

The present invention, in another aspect, discloses a method of forming a nanoscale pattern on a substrate surface. In one embodiment, the method includes the steps of providing a substrate having a surface; providing a nanoscale pattern forming device, comprising an elongated cantilever that has a tip portion proximate an end of the elongated cantilever; and illuminating at least the tip portion of the cantilever with a beam of substantially coherent monoenergetic particles when the cantilever moves relative to the substrate to form a nanoscale pattern on the surface, wherein the tip portion of the cantilever is made from a material that is responsive to the beam of substantially coherent monoenergetic particles.

The step of illuminating comprises the steps of toggling the beam such that when there is no need of patterning on the surface, at least the tip portion of the cantilever is not exposed to the illumination, and when there is a need of patterning on the surface, at least the tip portion of the cantilever is exposed to the illumination, respectively.

In one embodiment, the substrate surface comprises a hydrogen passivated silicon surface, wherein the hydrogen passivated silicon surface can be an H:Si(111) surface.

The nanoscale pattern forming device comprises an atomic force microscope (AFM) that is controllably movable at a scan rate and according to a predetermined trace corresponding to a nanoscale pattern to be formed.

In practicing the method, the step of illuminating includes illuminating at least the tip portion of the cantilever with electromagnetic radiation, selected from visible and infrared radiations, such that the monoenergetic particles are photons.

The electromagnetic radiation is from a laser, and the beam comprises a laser beam of photons, wherein the laser is operatable at a wavelength in the range of 10 to 10,000 nm and at an output in the range of 0.05 to 1,000 mW.

The material that is responsive to the beam of substantially coherent monoenergetic particles comprises doped n-type silicon or doped p-type silicon that has a free carrier concentration excitable by the beam of substantially coherent monoenergetic particles.

The present invention, in yet another aspect, discloses a system of forming a nanoscale pattern on a substrate surface. In one embodiment, the system has a nanoscale pattern forming device, comprising an elongated cantilever that has a tip portion proximate an end of the elongated cantilever; and an energy source for illuminating at least the tip portion of the cantilever with a beam of substantially coherent monoenergetic particles when the cantilever moves relative to the substrate to form a nanoscale pattern on the surface, wherein the tip portion of the cantilever is made from a material that is responsive to the beam of substantially coherent monoenergetic particles.

The material that is responsive to the beam of substantially coherent monoenergetic particles comprises doped n-type silicon or doped p-type silicon that has a free carrier concentration excitable by the beam of substantially coherent monoenergetic particles.

The nanoscale pattern forming device comprises an atomic force microscope (AFM) that is controllably movable at a scan rate and according to a predetermined trace corresponding to a nanoscale pattern to be formed.

The energy source comprises a laser, and the beam comprises a laser beam of photons.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. For example, multiple probes may be utilized at the same time to practice the present invention. Accordingly, the scope of the present invention is defined by the appended claims rather than the foregoing description and the exemplary embodiments described therein.

LIST OF REFERENCES

1. J. A. Dagata, J. Schneir, H. H. Harary, C. J. Evans, M. T. Postek, and J. Bennett, Appl. Phys. Lett. 56, 2001 (1990).
2. N. P. Guisinger, M. E. Greene, R. Basu, A. S. Baluch, and M. C. Hersam, Nano Lett. 4, 55 (2004).
3. L. M. Demers, D. S. Ginger, S. J. Park, Z. Li, S. W. Chung, and C. A. Mirkin, Science 296, 1836 (2002).
4. C. R. Kinser, M. J. Schmitz, and M. C. Hersam, Nano Lett. 5, 91 (2005).
5. P. Avouris, T. Hertel, and R. Martel, Appl. Phys. Lett. 71, 285 (1997).
6. B. Legrand and D. Stievenard, Appl. Phys. Lett. 74, 4049 (1999).
7. E. S. Snow, P. M. Campbell, and F. K. Perkins, Appl. Phys. Lett. 75, 1476 (1999).
8. B. A. Wacaser, M. J. Maughan, I. A. Mowat, T. L. Niederhauser, M. R. Linford, and R. C. Davis, Appl. Phys. Lett. 82, 808 (2003).
9. R. D. Piner, J. Zhu, F. Xu, S. H. Hong, and C. A. Mirkin, Science 283, 661 (1999).
10. M. E. Greene, C. R. Kinser, D. E. Kramer, L. S. C. Pingree, and M. C. Hersam, Microsc. Res. Tech. 64, 415 (2004).
11. H. Sugimura and N. Nakagiri, J. Am. Chem. Soc. 119, 9226 (1997).
12. M. Calleja, M. Anguita, R. Garcia, K. Birkelund, F. Perez-Murano, and J. A. Dagata, Nanotechnology 10, 34 (1999).
13. J. A. Dagata, F. Perez-Murano, C. Martin, H. Kuramochi, and H. Yokoyama, J. Appl. Phys. 96, 2386 (2004).
14. J. A. Dagata, F. Perez-Murano, C. Martin, H. Kuramochi, and H. Yokoyama, J. Appl. Phys. 96, 2393 (2004).
15. C. R. Kinser, M. J. Schmitz, and M. C. Hersam, Adv. Mater. 18, 1377 (2006).
16. E. S. Snow, G. G. Jernigan, and P. M. Campbell, Appl. Phys. Lett. 76, 1782 (2000).
17. H. Jin, C. R. Kinser, P. A. Bertin, D. E. Kramer, J. A. Libera, M. C. Hersam, S. T. Nguyen, and M. J. Bedzyk, Langmuir 20, 6252 (2004).
18. P. A. Anderson, Phys. Rev. 115, 553 (1959).
19. Geoffrey W. Brown, Holger Grube, and Marilyn E. Hawley, Phys. Rev. B 70, 121301(R) (2004).
20. G. H. Buh, J. J. Kopanski, J. F. Marchiando, A. G. Birdwell, and Y. Kuk, J. Appl. Phys. 94, 2680 (2003).
21. O. Schneegans, L. Boyer, F. Houze, R. Meyer, and P. Chretien, J. Vac. Sci. Technol. B 20, 1929 (2002).
22. W. I. Hamdi, J. Mater. Sci.-Mater. Electron. 8, 409 (1997).
23. Mandelis, J. Appl. Phys. 97, 083508 (2005).
24. Z. A. Weinberg, J. Appl. Phys. 53, 5052 (1982).

What is claimed is:

1. A method of forming a nanoscale pattern on a substrate surface, comprising the steps of:
    (a) providing a substrate having a surface;
    (b) providing a nanoscale pattern forming device, comprising an elongated cantilever that has an arm with a first end and a second end that is opposite to the first end, and a tip portion proximate the second end of the arm of the elongated cantilever, wherein the tip portion has a base at a first end and a tip at a second end that is opposite to the first end of the tip portion, and wherein the base is formed at the second end of the arm of the cantilever; and
    (c) controllably illuminating at least the base of the tip portion of the cantilever with a beam of substantially coherent monoenergetic particles when the cantilever moves relative to the substrate such as to excite a free carrier concentration of the tip portion to form a nanoscale pattern on the surface of the substrate, wherein the tip portion of the cantilever is made from lightly doped silicon.

2. The method of claim 1, wherein the substrate surface comprises a hydrogen passivated silicon surface.

3. The method of claim 2, wherein the hydrogen passivated silicon surface is an H:Si(111) surface.

4. The method of claim 1, wherein the nanoscale pattern forming device comprises an atomic force microscope (AFM) that is controllably movable at a scan rate and moves according to a predetermined trace corresponding to a nanoscale pattern to be formed.

5. The method of claim 1, wherein the step of controllably illuminating includes controllably illuminating at least the tip portion of the cantilever with electromagnetic radiation, selected from visible and infrared radiations, such that the monoenergetic particles are photons.

6. The method of claim 5, wherein the electromagnetic radiation is from a laser, and the beam comprises a laser beam of photons.

7. The method of claim 6, wherein the laser is operatable at a wavelength in the range of 10 to 10,000 nm and at an output in the range of 0.05 to 1,000 mW.

8. The method of claim 1, wherein the step of controllably illuminating comprises the steps of toggling the beam such that where there is no need of patterning on the surface, at least the tip portion of the cantilever is not exposed to the illumination, and where there is a need of patterning on the surface, at least the tip portion of the cantilever is exposed to the illumination, respectively.

9. A method of forming a nanoscale pattern on a substrate surface, comprising the steps of:
    (a) providing a substrate having a surface;
    (b) providing a nanoscale pattern forming device, comprising an elongated cantilever that has an arm with a first end and a second end that is opposite to the first end and a tip portion proximate the second end of the elongated cantilever, wherein the tip portion has a base at a first end and a tip at a second end that is opposite to the first end of the tip portion, and wherein the base is formed at the second end of the arm of the cantilever; and
    (c) illuminating at least the base of the tip portion of the cantilever with a beam of substantially coherent monoenergetic particles when the cantilever moves relative to the substrate such as to excite a free carrier concentration of the tip potion to form a nanoscale pattern on the surface of the substrate, wherein the tip portion of the cantilever is made from a material that is responsive to the beam of substantially coherent monoenergetic particles.

10. The method of claim 9, wherein the substrate surface comprises a hydrogen passivated silicon surface.

11. The method of claim 10, wherein the hydrogen passivated silicon surface is an H:Si(111) surface.

12. The method of claim 9, wherein the nanoscale pattern forming device comprises an atomic force microscope (AFM) that is controllably movable at a scan rate and moves according to a predetermined trace corresponding to a nanoscale pattern to be formed.

13. The method of claim 9, wherein the step of illuminating includes illuminating at least the tip portion of the cantilever with electromagnetic radiation, selected from visible and infrared radiations, such that the monoenergetic particles are photons.

14. The method of claim 13, wherein the electromagnetic radiation is from a laser, and the beam comprises a laser beam of photons.

15. The method of claim 14, wherein the laser is operatable at a wavelength in the range of 10 to 10,000 nm and at an output in the range of 0.05 to 1,000 mW.

16. The method of claim 9, wherein the material that is responsive to the beam of substantially coherent monoenergetic particles comprises doped n-type silicon or doped p-type silicon that has a free carrier concentration excitable by the beam of substantially coherent monoenergetic particles.

17. The method of claim 9, wherein the step of illuminating comprises the steps of toggling the beam such that when there is no need of patterning on the surface, at least the tip portion of the cantilever is not exposed to the illumination, and when there is a need of patterning on the surface, at least the tip portion of the cantilever is exposed to the illumination, respectively.

* * * * *

UNITED STATES PATENT AND TRADEMARK OFFICE
CERTIFICATE OF CORRECTION

PATENT NO. : 7,976,765 B2  Page 1 of 1
APPLICATION NO. : 12/180173
DATED : July 12, 2011
INVENTOR(S) : Mark C. Hersam It is certified that error appears in the above-identified patent and that said Letters Patent is hereby corrected as shown below:

In the Specification:

In column 1, Lines 19-24, please delete:

~~This invention was made with Government support under Contract No. EEC-0647569 awarded by National Science Foundation of the United States and Contract No. W911NF-05-1-0177 awarded by the Young Investigator Program of Army Research Office of the United States. The government has certain rights in the invention.~~

In column 1, Lines 19-24, please add:

--This invention was made with government support under grant number EEC0647569 awarded by the National Science Foundation and grant number W911NF-05-1-0177 awarded by the Army Research Office. The government has certain rights in the invention.--

Signed and Sealed this
Twenty-seventh Day of September, 2011

David J. Kappos
*Director of the United States Patent and Trademark Office*